(12) United States Patent
Teramoto

(10) Patent No.: US 8,331,165 B2
(45) Date of Patent: Dec. 11, 2012

(54) SEMICONDUCTOR DEVICE

(75) Inventor: Kazuhiro Teramoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 223 days.

(21) Appl. No.: 12/909,016

(22) Filed: Oct. 21, 2010

(65) Prior Publication Data

US 2011/0096613 A1   Apr. 28, 2011

(30) Foreign Application Priority Data

Oct. 27, 2009   (JP) .................................. 2009-246305

(51) Int. Cl.
*G11C 5/14* (2006.01)
(52) U.S. Cl. .................... 365/189.09; 365/154; 365/203; 365/230.03
(58) Field of Classification Search .................. 365/154, 365/189.09, 203, 230.06
See application file for complete search history.

(56) References Cited

U.S. PATENT DOCUMENTS

| | | | |
|---|---|---|---|
| 6,493,275 B2 * | 12/2002 | Tomita | 365/189.09 |
| 2005/0135168 A1 | 6/2005 | Kim | |

FOREIGN PATENT DOCUMENTS

JP   2005-182994   7/2005

* cited by examiner

*Primary Examiner* — Jason Lappas
(74) *Attorney, Agent, or Firm* — Morrison & Foerster LLP

(57) ABSTRACT

A semiconductor device includes a plurality of first output terminals 1-13 and a plurality of first output circuits 203,204 provided corresponding to each of the plurality of first output terminals and coupled to a corresponding first output terminal. The semiconductor device further includes a second output circuit 201 coupled to a second output terminal DQS. The second output circuit automatically adjusts a slew rate based on the state transitions of the plurality of first output circuits. The second output circuit adjusts the slew rate from a first state to a second state based on a transition from first data outputted from the first output circuit to second data following said first data. The second output circuit outputs data in synchronization with the second data with a slew rate in said second state.

10 Claims, 10 Drawing Sheets

FIG. 6A
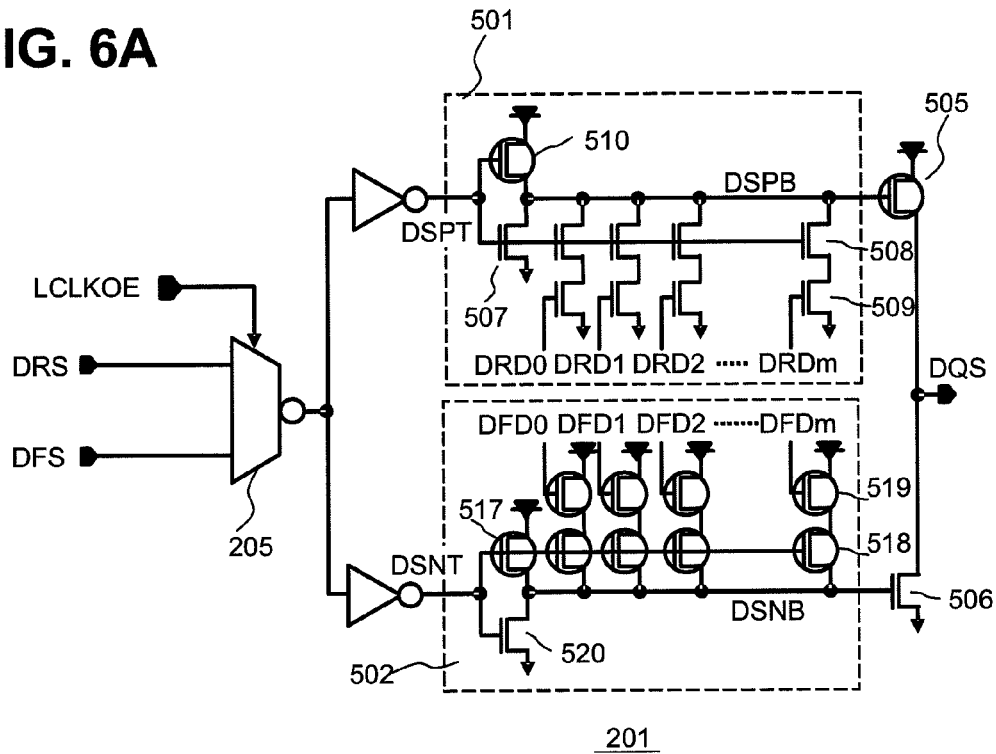
FIG. 6B
FIG. 6C
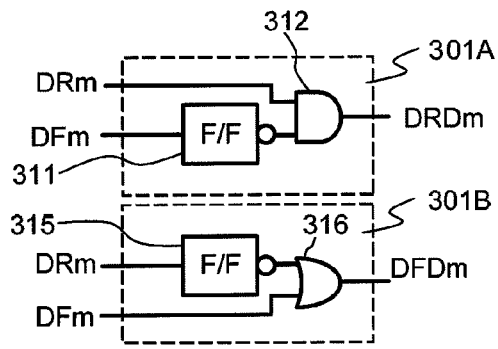

FIG. 7A
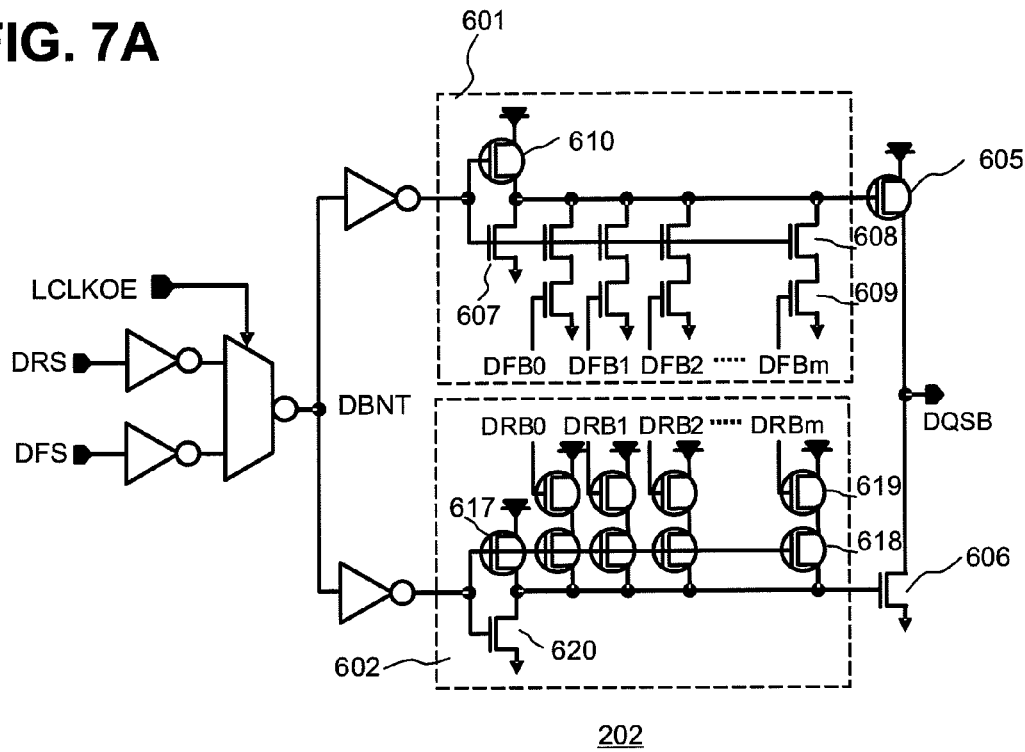
FIG. 7B
FIG. 7C
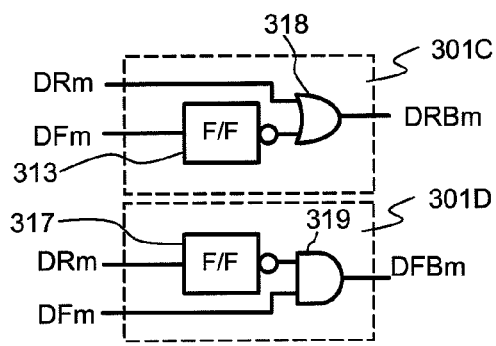

| DRDm | DFm[tn-1] | | | DRBm | DFm[tn-1] | | | DFDm | DRm[tn] | | | DFBm | DRm[tn] | |
|---|---|---|---|---|---|---|---|---|---|---|---|---|---|---|
| | L | H | | | L | H | | | L | H | | | L | H |
| DRm[tn] L | L | L | | DRm[tn] L | L | H | | DFm[tn] L | H | L | | DFm[tn] L | L | L |
| DRm[tn] H | H | L | | DRm[tn] H | H | H | | DFm[tn] H | H | H | | DFm[tn] H | H | L |

SEMICONDUCTOR DEVICE

REFERENCE TO RELATED APPLICATION

This application is based upon and claims the benefit of the priority of Japanese patent application No. 2009-246305, filed on Oct. 27, 2009, the disclosure of which is incorporated herein in its entirety by reference thereto.

TECHNICAL FIELD

The present invention relates to a semiconductor device, and particularly to a semiconductor device comprising a data output terminal and a terminal outputting a synchronization signal synchronized with the transition of data outputted from the data output terminal.

BACKGROUND

In a system using a plurality of semiconductor devices, a system that performs data transfer by transmitting a synchronization signal in parallel with data and in synchronization with the transition of the data in order to transfer data between the semiconductor devices at high speed is used. For instance, in a case where the semiconductor devices are a semiconductor memory device such as a DRAM (Dynamic Random Access Memory) and a memory controller that controls the semiconductor memory device, a protocol such as DDR SDRAM (Double Data Rate Synchronous DRAM) is provided so that data transfer between the semiconductor devices such as the DRAM and the memory controller can be performed at high speed.

In recent years, the speed of systems using DRAM has particularly increased, and so has the transfer speed of data read/written from/to semiconductor devices constituting the systems. In a DRAM that needs to output data to a memory controller at high speed, DQS and DQSB signals are outputted from the DRAM to the memory controller as synchronization signals (data strobe signals) constituted by differential signals of normal and inverted signals when data read from the DRAM are transferred to the memory controller, and the memory controller uses these DQS and DQSB signals as signals that determine the timing at which DQ signals (data signals) from the DRAM is acquired. Because the data strobe signals are differential signals, they can be made into transmission signals having small amplitudes and resistant to external noise.

FIG. 1 shows timing relations between normal and inverted data strobe signals DQS and DQSB, i.e., signals outputted from the DRAM when read data are transferred from the DRAM to the memory controller, and the data signals DQ0, DQ1, ..., DQm of multiple bits. The DRAM outputs DQS and DQSB, and DQ0, DQ1, ..., DQm at the same timing. At this time, the output skew between DQS and DQSB, and DQ is standardized as tDQSQ. Further, the skew between when DQS and DQSB have changed and when the data switch to the next data is standardized as tQH. The system acquiring DQS, DQSB, and DQ0-$m$ outputted from the DRAM delays DQS and DQSB sent from the DRAM inside the system so that it can acquire the data DQ0, DQ1, ..., DQm. In FIG. 1, DQS and DQSB internally delayed by the memory controller receiving the data outputted from the DRAM are denoted as DQS (in) and DQSB (in). The valid period during which the data can be acquired using DQS and DQSB is a period tQH-tDQSQ. tQH is a timing at which the data switch to the next data, and it is bottlenecked by the system clock operating frequency used in data transfer between the semiconductor devices and the system. Here, the data setup time for DQS (in) and DQSB (in) is tS, and the hold time is tH. The longer tS and tH are, the larger the margin for data acquisition error becomes, however, tS and tH are bottlenecked by the clock frequency since they are bottlenecked by tDQSQ and tQH.

Patent Document 1 describes a semiconductor device capable of adjusting the slew rate of a data output signal according to an external command.

[Patent Document 1]

Japanese Patent Kokai Publication No. JP-P2005-182994A, which corresponds to US Patent Application Publication No. US2005/0135168A1.

SUMMARY

The disclosure of the above Patent Document 1 is incorporated herein by reference thereto. The following analysis is given by the present invention. In the conventional technology described using FIG. 1, the skew between the differential signals DQS and DQSB is a significant factor determining the characteristics for these signals. A skew deviation between DQS and DQSB increases the setup time and hold time for data to be acquired, resulting in an increase in tQH and bottlenecking the operating frequency of the system.

Vox is a value specifying the skew between DQS and DQSB. Vox indicates how much an intersection of the differential signals DQS and DQSB deviates from a half of the VDDQ potential, i.e., the center of the amplitude. The smaller Vox is, i.e., the smaller the deviation from a half of the VDDQ potential is, the smaller the skew deviation between DQS and DQSB becomes, resulting in desirable characteristics. The setup time and the hold time inevitably decrease as the clock frequency of the system increases. As for Vox at the DRAM, for instance, in a case of DDR SDRAM, the deviation from a half of the VDDQ potential needs to be suppressed as the speed of the DDR SDRAM increases from DDR 1 to DDR2, and from DDR2 to DDR3.

However, the synchronization signals DQS and DQSB and the data signal DQ change simultaneously when data are read from the DRAM, and the slew rate of the synchronization signals DQS and DQSB is influenced by the switching noise of the changing data signal DQ, increasing Vox, the deviation from a half of the VDDQ potential.

According to a first aspect of the present invention, there is provided a semiconductor device comprising a first circuit that outputs data to a first output terminal and a second circuit that outputs data to a second output terminal. The first circuit and the second circuit output data in synchronization with each other. The second circuit adjusts a slew rate from a first state to a second state based on a transition from first data outputted from the first circuit to second data following the first data, and outputs data in synchronization with the second data with a slew rate in the second state.

According to a second aspect of the present invention, there is provided a semiconductor device comprising a plurality of first output circuits that respectively output data to a plurality of first output terminals, a second output circuit that outputs data to a second output terminal, and a comparator circuit. The plurality of first output circuits and the second output circuit output data in synchronization with each other. The comparator circuit compares first data respectively outputted from the plurality of first output circuits and second data following the first data, and outputs the comparison results to the second output circuit. The second output circuit adjusts a slew rate from a first state to a second state based on the comparison results and outputs data with the second slew rate in synchronization with the second data.

According to a third aspect of the present invention, there is provided a semiconductor device comprising a plurality of first output terminals, a second output terminal, a plurality of first output circuits provided corresponding to each of the plurality of first output terminals and coupled to the corresponding first output terminal, and a second output circuit coupled to the second output terminal. The second output circuit automatically adjusts a slew rate based on state transitions of the plurality of first output circuits.

The meritorious effects of the present invention are summarized as follows. According to the present invention, since a second output circuit coupled to a second output terminal automatically adjusts a slew rate based on the state transitions of a first output circuit coupled to a first output terminal. An influence on the slew rate of a signal outputted from the second output terminal by the transition of a data signal outputted from the first output terminal can be avoided.

BRIEF DESCRIPTION OF THE DRAWINGS

FIG. 6A is a circuit block diagram of the synchronization signal output circuit in the example; FIG. 6B is a circuit block diagram of a comparator circuit; and FIG. 6C is a Karnaugh map (truth table) of the same.

FIG. 7A is a circuit block diagram of an inverted synchronization signal output circuit in the example; FIG. 7B is a circuit block diagram of a comparator circuit; and FIG. 7C is a Karnaugh map (truth table) of the same.

PREFERRED MODES

Before describing concrete examples of the present invention in detail, a supplementary explanation as to why the slew rate and Vox of synchronization signals outputted from synchronization signal output terminals (DQS and DQSB terminals) are influenced by the transition of data outputted from another output terminal (DQ terminal) will be given.

Figure 1:
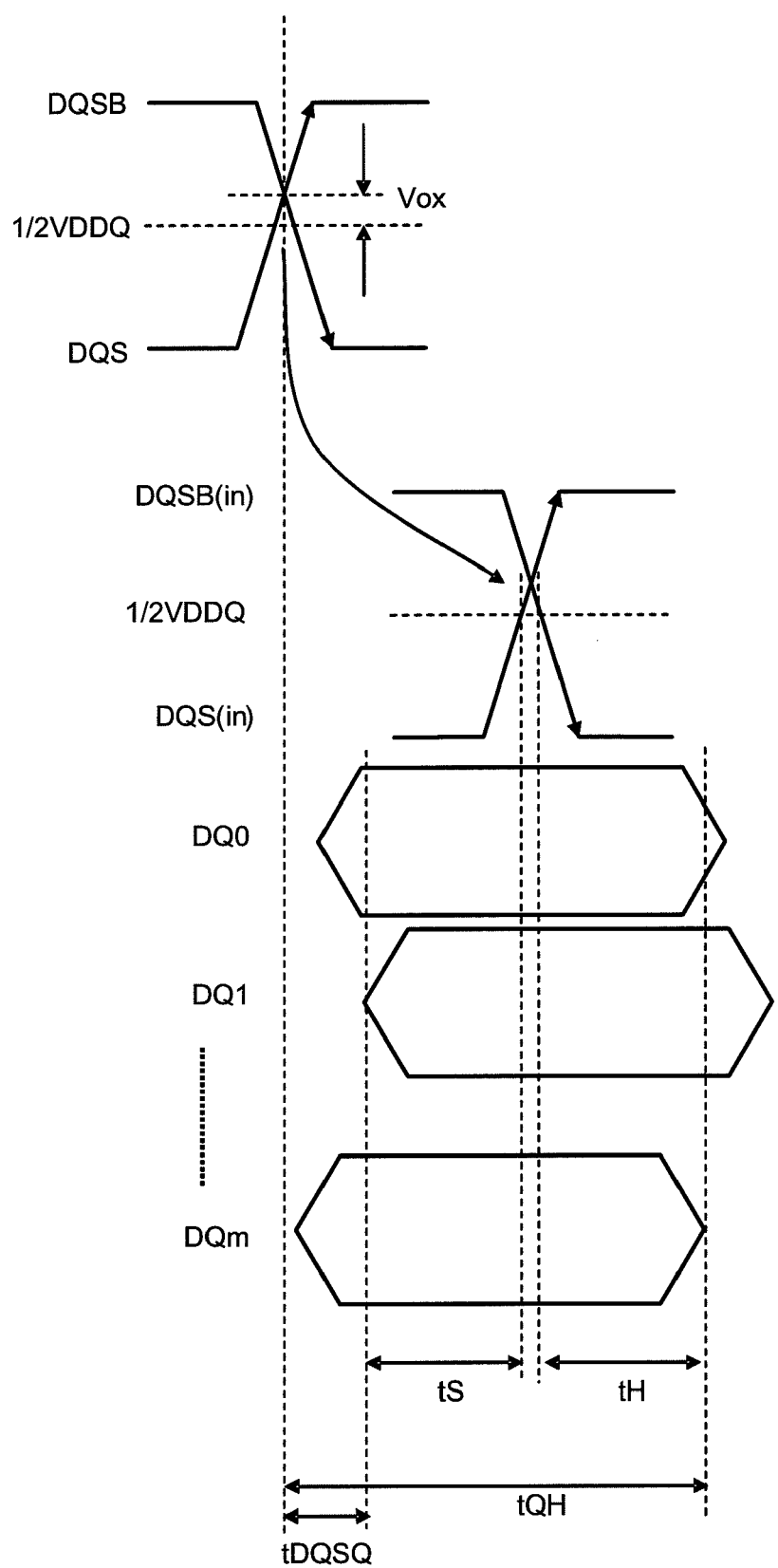
FIG. 1 is a drawing for explaining the timings of data signals and data strobe signals outputted from a synchronous semiconductor memory device.
Figure 2:
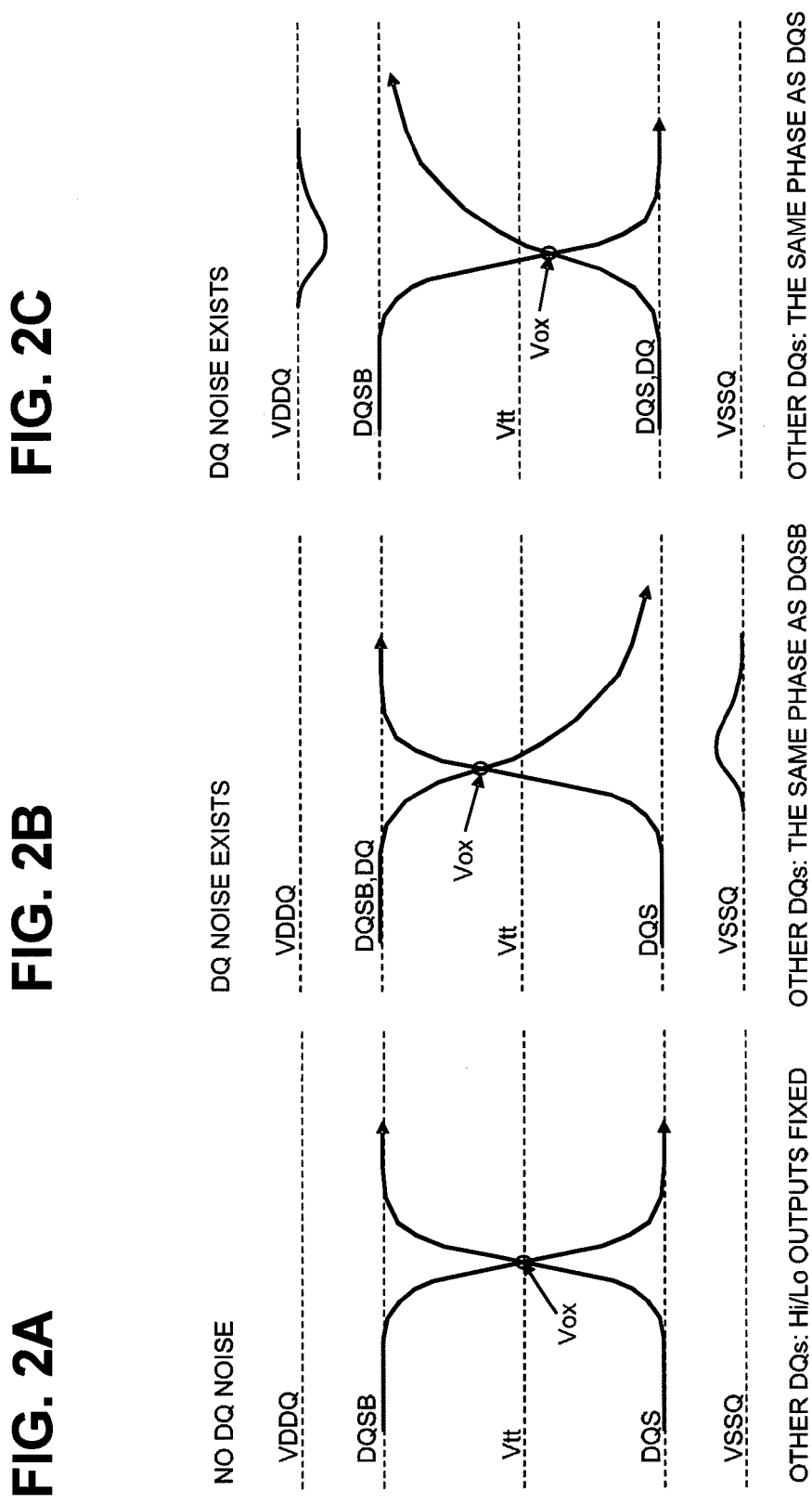
FIG. 2A is a waveform diagram of data strobe signals when a data signal does not change at the same as the data strobe signals in a synchronous semiconductor memory device.
FIG. 2B is a waveform diagram of the data strobe signals when the data signal falls at the same as the data strobe signals.
FIG. 2C is a waveform diagram of the data strobe signals when the data signal rises at the same as the data strobe signals.

FIGS. 2A, 2B, and 2C are waveform diagrams when read data are outputted in a synchronous semiconductor memory device. The semiconductor memory device outputs serial data signals DQ of multiple bits from a data output terminal in synchronization with data strobe signals outputted from synchronization signal output terminals (DQS and DQSB terminals). The timing at which the data signals DQ serially outputted transition to the next serial data is the same as the timing at which the synchronization signals DQS and DQSB change. Further, the DQS and DQSB signals and the DQ signals outputted from the semiconductor memory device are supplied from the same power supply system; power is supplied to an output buffer circuit that outputs the DQS and DQSB signals and to an output buffer circuit that outputs the DQ signals from the same power supplies VDDQ and VSSQ. In many cases, the DQ terminals are provided for a plurality of bits (generally from 4 bits to 16 bits), and the serial data of multiple bits are outputted in parallel from the plurality of DQ terminals in synchronization with the DQS and DQSB signals at the time of read operation.

Further, the DQS signal and the DQSB signal are complimentary to each other. When one of them rises, the other falls at the same time, and when one falls, the other rises simultaneously.

Further, the data outputted from the DQ terminals at the same time as the DQS and DQSB signals transition to the next data, however, whether the data outputted from the DQ terminals rise or fall at the same time as the DQS signal and the DQSB signal, or maintain a high level or low level depends on the previous data and the next data read from the semiconductor memory device.

FIG. 2A shows a case where the DQS signal rises, the DQSB signal falls, and the data outputted from the DQ terminals do not change (maintain a high level or low level). Further, in the explanations of FIGS. 2A, 2B, and 2C, it is assumed that all the bits of the DQ signals outputted from the plurality of DQ terminals change in the same direction (rise or fall) simultaneously. The reason for this assumption is that the slew rate of the DQS and DQSB signals is the most susceptible to the influence of the DQ signal in such a case. In FIG. 2A, since there is not any bit of the DQ signals that changes at the same as the rise of the DQS signal and the fall of the DQSB signal, the DQ signal dose not influence the rise of the DQS signal and the fall of the DQSB signal. In this case, the DQS signal and the DQSB signal intersect at voltage Vtt=½(VDDQ+VSSQ).

FIG. 2B shows a case where the DQ signals of multiple bits fall all at once in synchronization with the rise of the DQS signal and the fall of the DQSB signal. In this case, since the multi-bit DQ signal output circuit outputs a low level simultaneously and a current flows from the DQ output terminals to the power supply VSSQ, the power supply VSSQ in the semiconductor memory device floats. Once the power supply VSSQ floats, the DQSB signal that falls at the same as the DQ signal is influenced by the floating of the power supply VSSQ. Then, the fall of the DQSB signal is delayed and the slew rate, i.e., the slope of the fall, decreases. As a result, the voltage Vox where the DQS signal and DQSB signal intersect increases due to the delay in the fall of the DQSB signal, deviating up from Vtt.

Meanwhile, FIG. 2C shows a case where the DQ signals of multiple bits rise all at once in synchronization with the fall of the DQSB signal and the rise of the DQS signal. In this case, since the multi-bit DQ signal output circuit outputs a high level simultaneously and a current flows from the power supply VDDQ to each DQ terminal, the power supply VDDQ in the semiconductor memory device drops down. Once the power supply VDDQ drops down, the DQS signal that rises at the same as the DQ signal is influenced by the drop in the power supply VDDQ. Then, the rise of the DQS signal is delayed and the slew rate, i.e., the slope of the rise, decreases. As a result, the voltage Vox where the DQS signal and DQSB signal intersect decreases due to the delay in the rise of the DQS signal, deviating down from Vtt.

If the voltage Vox deviates from the voltage Vtt as shown in FIGS. 2B and 2C, the setup time and hold time characteristics on the side of the memory controller acquiring the DQ signal deteriorate, impeding high speed data transfer.

Figure 4:
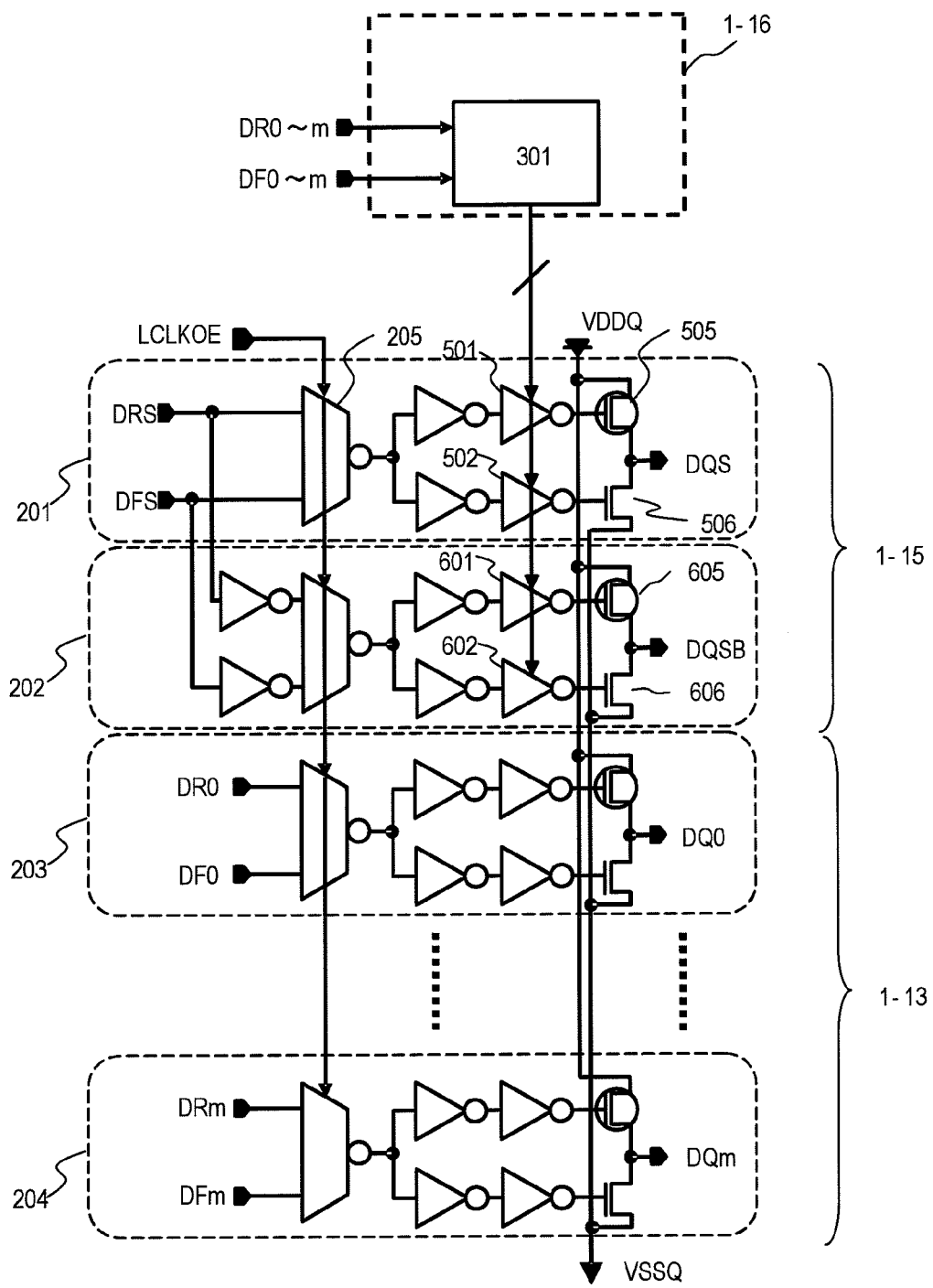
FIG. 4 is an entire circuit block diagram of a synchronization signal output circuit and a data signal output circuit in the example.

As an example shown in FIG. 4, a semiconductor device of a mode of the present invention comprises a first circuit (1-13) that outputs data to a first output terminal and a second circuit (1-15) that outputs data to a second output terminal; the first and the second circuits output data in synchronization with each other; and the second circuit (1-15) is capable of adjusting the slew rate from a first state to a second state (for instance by adjusting the drive capability of first drive circuits 501 and 601 or second drive circuits 502 and 602 using an output signal of a comparator circuit 301) based on the transition from first data (for instance DF0 to m) outputted from the first circuit to second data (DR0 to m) ensuing the first data, and of outputting data with the slew rate in the second state in synchronization with the second data.

According to the semiconductor device of the present invention, a second output circuit 201 coupled to a second output terminal (for instance DQS) automatically adjusts the slew rate based on the state transitions of a plurality of first output circuits (203 and 204). As a result, the fact that the slew rate is influenced by the transition of data outputted from the plurality of first output terminals can be compensated.

Further, the following preferred modes are possible in the present invention.

[Mode 1]

The semiconductor device as defined in the first aspect is preferred.

[Mode 2]

In the semiconductor device of Mode 1 described above, it is preferable that the second circuit be a circuit that outputs a synchronization signal synchronized to the transition of data outputted from the first output terminal as data from the second output terminal. The slew rate is adjusted to increase in a case where the logic levels of the data outputted from the first output terminal and the synchronization signal outputted from the second output terminal transition between a first logic level and a second logic level in a same direction and in synchronization with each other.

[Mode 3]

Figure 9:
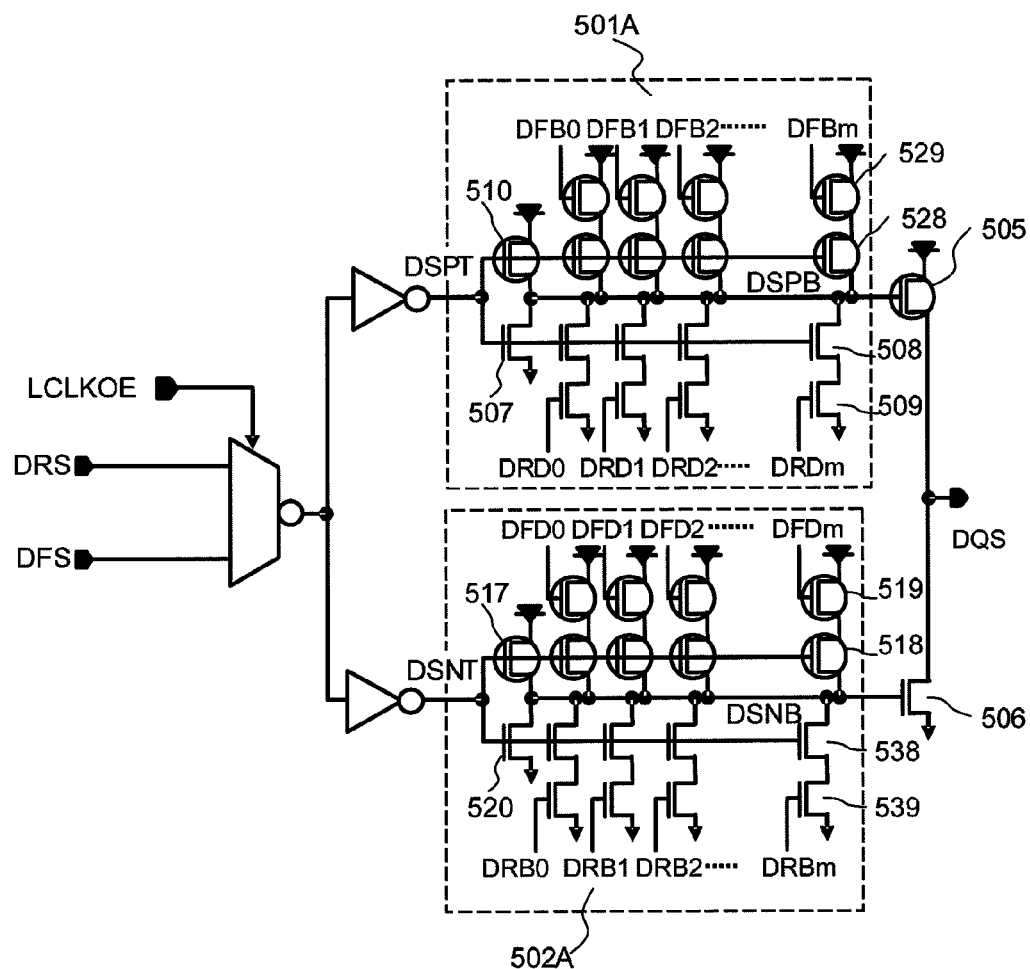
FIG. 9 is a circuit block diagram of a synchronization signal output circuit in another example.
Figures 10A, 10B:
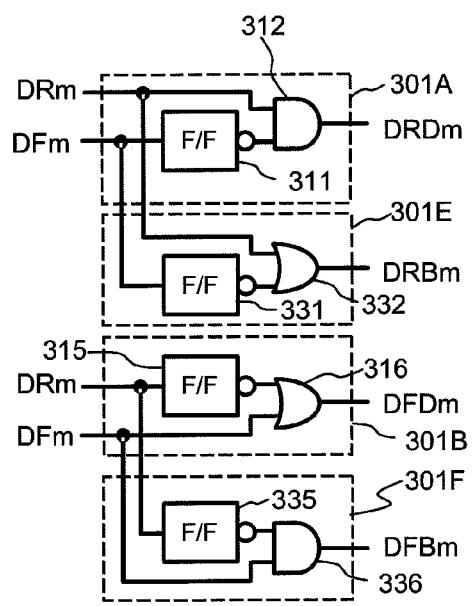
FIG. 10A is a circuit block diagram of a comparator circuit in another example.
FIG. 10B is a Karnaugh map of the same.

In the semiconductor device of Mode 2 described above, it is preferable that the slew rate is adjusted to decrease in a case where the logic levels of the data outputted from the first output terminal and the synchronization signal outputted from the second output terminal change in reverse directions and in synchronization with each other. An example of Mode 3 is shown in FIGS. 9, 10A, and 10B.

[Mode 4]

In the semiconductor devices of Modes 1 to 3 described above, it is preferable that a comparator circuit that compares the first data and the second data be further provided, that the second circuit include an output transistor coupled to the second output terminal and a drive circuit coupled to the output transistor, and that the drive circuit switch the output transistor with its drive capability changed based on the comparison results of the comparator circuit. An example of the comparator circuit is 301 in FIG. 4. An example of the output transistor is 505 or 506 in FIG. 6A or 9. An example of the drive circuit is 501, 502, 501A, or 502A in FIG. 6A or 9.

[Mode 5]

In the semiconductor devices of Modes 1 to 3 described above, it is preferable that a comparator circuit that compares the first data and the second data be further provided; that the second circuit comprise an output transistor of a first conductivity type, coupled to the second output terminal, that turns on when the second output terminal outputs a signal of a first logic level, an output transistor of a second conductivity type, coupled to the second output terminal, that turns on when the second output terminal outputs a signal of the second logic level, a first drive circuit that drives the output transistor of the first conductivity type, and a second drive circuit that drives the output transistor of the second conductivity type; that the first drive circuit drive the output transistor of the first conductivity type with its drive capability increased so that the output transistor of the first conductivity type quickly transitions from an OFF state to an ON state when the output transistor of the first conductivity type transitions from an OFF state to an ON state and the comparison results of the comparator circuit indicate that the first data are at the second logic level and the second data are at the first logic level; and that the second drive circuit drive the output transistor of the second conductivity type with its drive capability increased so that the output transistor of the second conductivity type quickly transitions from an OFF state to an ON state when the output transistor of the second conductivity type transitions from an OFF state to an ON state and the comparison results of the comparator circuit indicate that the first data are at the first logic level and the second data are at the second logic level. An example of the comparator circuit is 301 in FIG. 4. An example of the output transistor of the first conductivity type is 505 in FIG. 5A or 9. An example of the output transistor of the second conductivity type is 506 in FIG. 5A or 9. An example of the first drive circuit is 501 or 501A in FIG. 5A or 9. An example of the second drive circuit is 502 or 502A in FIG. 5A or 9.

[Mode 6]

In the semiconductor device of Mode 5 described above, it is preferable that the first drive circuit drive the output transistor of the first conductivity type with its drive capability decreased so that the output transistor of the first conductivity type slowly transitions from an ON state to an OFF state when the output transistor of the first conductivity type transitions from an ON state to an OFF state and the comparison results of the comparator circuit indicate that the first data are at the second logic level and the second data are at the first logic level; and that the second drive circuit drive the output transistor of the second conductivity type with its drive capability decreased so that the output transistor of the second conductivity type slowly transitions from an ON state to an OFF state when the output transistor of the second conductivity type transitions from an ON state to an OFF state and the comparison results of the comparator circuit indicate that the first data are at the first logic level and the second data are at the second logic level. An example of the first drive circuit and the second drive circuit are 501A and 502A in FIG. 9.

[Mode 7]

In the semiconductor device of Mode 2 or 3 described above, a third output terminal and a third circuit that outputs an inverted synchronization signal whose logic is the inversion of the logic of the synchronization signal from the third output terminal are further provided; and a slew rate of the third circuit is adjusted to increase in a case where the logic levels of the data outputted from the first output terminal and the inverted synchronization signal outputted from the third output terminal transition between the first logic level and the second level in the same direction and in synchronization with each other. An example of the third output terminal and the third circuit are DQSB and 202 in FIG. 4.

[Mode 8]

In the semiconductor device of Mode 7 described above, it is preferable that the slew rate of the third circuit be adjusted to decrease in a case where the logic levels of the data outputted from the first output terminal and the inverted synchronization signal outputted from the third output terminal change in the reverse directions and in synchronization with each other.

[Mode 9]

The semiconductor device as defined in the second aspect is preferable.

[Mode 10]

In the semiconductor device of Mode 9 described above, it is preferable that the second output circuit comprise a first output transistor of a first conductivity type that turns on when a signal of a first logic level is outputted, a second output transistor of a second conductivity type that turns on when a signal of a second logic level is outputted, a first drive circuit that drives the first output transistor and that includes a plurality of second conductivity type transistors for adjusting slew rate provided corresponding to each of a plurality of first output circuits, and a second drive circuit that drives the second output transistor and that includes a plurality of first conductivity type transistors for adjusting slew rate provided corresponding to each of the plurality of first output circuits; that each of the plurality of second conductivity type transistors for adjusting slew rate be turned on when the first output transistor is transitioned from an OFF state to an ON state and the comparison results of the comparator circuit indicate that the first data of corresponding one of the plurality of first output circuits is at the second logic level and the second data of the corresponding one is at the first logic level; and each of the plurality of first conductivity type transistors for adjusting slew rate be turned on when the second output transistor is transitioned from an OFF state to an ON state and the comparison results of the comparator circuit indicate that the first data of corresponding one of the plurality of first output circuits is at the first logic level and the second data of the corresponding one is at the second logic level. An example of the first and the second output transistor are 505 and 506 in FIG. 6A or 9. An example of the first drive circuit is 501 or 501A in FIG. 6A or 9. An example of the second drive circuit is 502 or 502A in FIG. 6A or 9. An example of the plurality of second conductivity type transistors for adjusting slew rate of the first drive circuit are 509 in FIG. 6A or 9. An example of the plurality of first conductivity type transistors for adjusting slew rate of the second drive circuit are 519 in FIG. 6A or 9.

[Mode 11]

In the semiconductor device of Mode 10 described above, it is preferable that the first drive circuit further include a plurality of first conductivity type transistors for adjusting slew rate provided corresponding to each of the plurality of first output circuits; that the second drive circuit further include a plurality of second conductivity type transistors for adjusting slew rate provided corresponding to each of the plurality of first output circuits; that each of the plurality of first conductivity type transistor for adjusting slew rate of the first drive circuit be turned on when the first output transistor is transitioned from an ON state to an OFF state except in a case where the comparison results of the comparator circuit indicate that the first data of corresponding one of the plurality of first output circuits is at the second logic level and the second data of the corresponding one is at the first logic level; and that each of the plurality of second conductivity type transistors for adjusting slew rate of the second drive circuit be turned on when the second output transistor is transitioned from an ON state to an OFF state except in a case where the comparison results of the comparator circuit indicate that the first data of corresponding one of the plurality of first output circuits is at the first logic level and the second data of corresponding one is at the second logic level. An example of the plurality of first conductivity type transistors for adjusting slew rate of the first drive circuit are 529 in FIG. 9. An example of the plurality of second conductivity type transistors for adjusting slew rate of the second drive circuit are 539 in FIG. 9.

[Mode 12]

In the semiconductor device of Mode 10 or 11 described above, it is preferable that the first output transistor be coupled between a first power supply and the second output terminal; the second output transistor be coupled between a second power supply and the second output terminal; the plurality of first conductivity type transistors for adjusting slew rate be coupled between a gate of the second output transistor and the first power supply; and that the plurality of second conductivity type transistors for adjusting slew rate be coupled between a gate of the first output transistor and the second power supply.

[Mode 13]

In the semiconductor devices of Modes 1 to 12, it is preferable that a storage circuit be further included and the first data and the second data be data read from the storage circuit. An example of the storage circuit is 1-1 in FIG. 3.

[Mode 14]

The semiconductor device as defined in the third aspect is preferred.

[Mode 15]

In the semiconductor device of MODE 14 described above, it is preferable that the second output terminal be a synchronization signal output terminal; that the second output circuit be a synchronization signal output circuit that outputs a synchronization signal from the synchronization signal output terminal; that the plurality of first output circuits output data signals whose data transition in synchronization with the synchronization signal from each corresponding first output terminal; and that the synchronization signal output circuit automatically adjust the slew rate so that it is higher in a case where the data signal changes from a first logic level to a second logic level than in a case where the data signal changes from the second logic level to the first logic level when the synchronization signal changes from the first logic level to the second logic level.

[Mode 16]

In the semiconductor device of MODE 15 described above, it is preferable that an inverted synchronization signal output terminal that outputs an inverted synchronization signal obtained by inverting the phase of the synchronization signal and an inverted synchronization signal output circuit coupled to the inverted synchronization signal output terminal be further provided; and that the inverted synchronization signal output circuit automatically adjust the slew rate so that it is higher in a case where the data signal changes from the first logic level to the second logic level than in a case where the data signal changes from the second logic level to the first logic level when the inverted synchronization signal changes from the first logic level to the second logic level.

[Mode 17]

It is preferable that the semiconductor devices of Modes 1 to 16 described above be synchronous semiconductor memory devices that output read data from a data input/output terminal in synchronization with a data strobe signal outputted from a data strobe signal input/output terminal in response to a read command supplied externally.

In the following descriptions, synchronous semiconductor memory devices are used as examples, however, the application of the present invention is not limited to synchronous semiconductor memory device. The present invention can generally be applied to semiconductor devices and can prevent the slew rate of a particular output terminal from being influenced by data outputted from other output terminals. For instance, the present invention is particularly effective in a case where the logic level of a particular output terminal changes at the same time as other output terminals and the particular output terminal is a output terminal that outputs an operation reference signal such as a data strobe signal output terminal. In the examples below, the slew rate of differential data strobe signals (synchronization signals) is adjusted, however, the output terminal having the slew rate adjusted may be a terminal outputting a single-phase synchronization signal. Further, the output terminal having the slew rate adjusted is not limited to a terminal outputting a synchronization signal. Moreover, the output terminal in the present invention may be an input/output terminal having a function as an input terminal in addition to as an output terminal.

Below, the examples are described in detail with reference to the drawings.

Example 1

Figure 3:
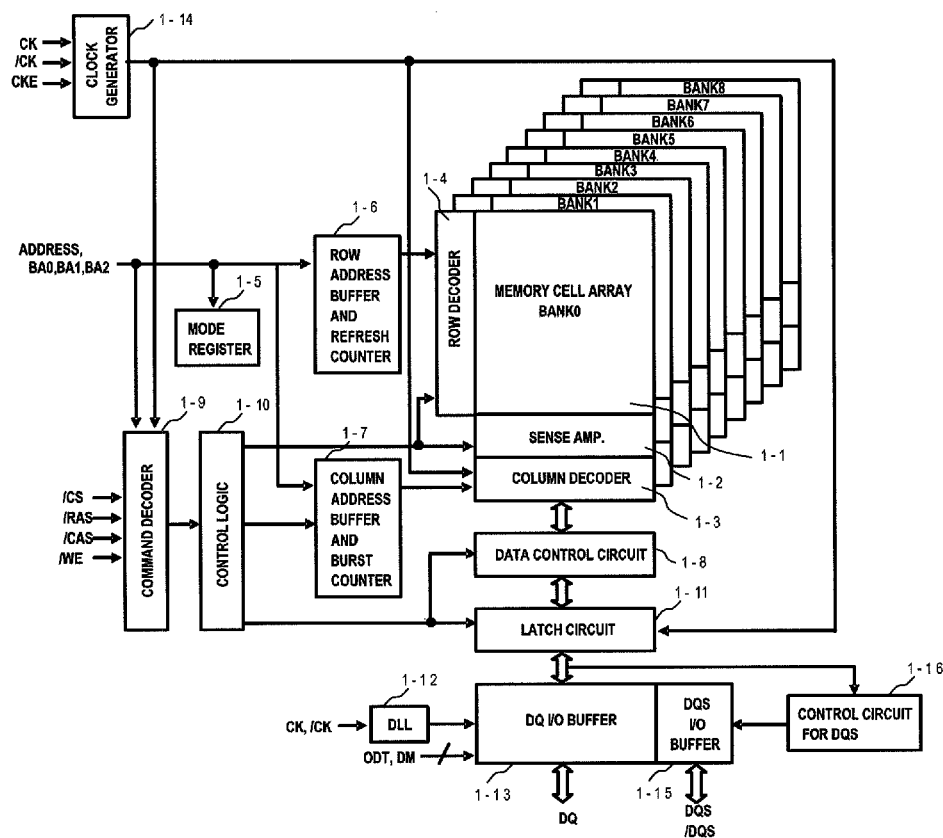
FIG. 3 is a block diagram showing an entire configuration of a semiconductor memory device in an example of the present invention.

FIG. 3 is a block diagram showing an entire configuration of a semiconductor device 100 in Example 1. The semiconductor device 100 in FIG. 3 is an eight-bank DDR (Double Data Rate: data are transferred on both the rising and falling edges of the clock signal) SDRAM (Synchronous DRAM), without being limited to this. In FIG. 3, a row decoder 1-4 decodes a row address and drives a selected word line (not shown in the drawing). A sense amplifier 1-2 amplifies data read into a bit line (not shown in the drawing) of a memory cell array 1-1, and amplifies cell data read into a bit line connected to the cell of a word line selected by a refresh address and writes the data back to the cell during refresh operation. A column decoder 1-3 decodes a column address, turns on a selected Y switch (not shown in the drawing) and selects a bit line, and connect it to I/O lines (not shown in the drawing). A command decoder 1-9 receives a predetermined address signal and a chip select signal /CS, a row address strobe signal /RAS, a column address strobe signal /CAS, and a write enable signal /WE as control signals, and decodes the command. ("/" in a signal name indicates that the signal becomes active when it is at a low level.) Under the control of a control logic 1-10 that receives a control signal from the command decoder 1-9, a column address buffer and a burst counter 1-7 generate an address of a burst length from a column address received, and supplies it to the column decoder 1-3. A mode register 1-5 receives the address signal and signals BA0, BA1, and BA2 for selecting a bank (selecting one of the eight banks) and outputs a control signal to the control logic 1-10.

The row address buffer of a row address buffer and refresh counter 1-6 receives a row address and outputs it to the row decoder 1-4, and the refresh counter receives a refresh command, performs a count-up operation, and outputs a count output as a refresh address. A multiplexer (not shown in the drawing) receives the row address from the row address buffer and the refresh address from the refresh counter, selects the refresh address during refresh operation, and selects the row address from the row address buffer and supplies it to the row decoder 1-4 at other times.

A clock generator 1-14 receives complementary external clocks CK and /CK supplied to the DRAM device, outputs an internal clock when a clock enable signal CKE is at a high level, and stops supplying the clock thereafter when the clock enable signal CKE is at a low level.

A data control circuit 1-8 performs input/output of write data and read data. A latch circuit 1-11 latches the write data and the read data. An input/output buffer 1-13 performs input/output of data from a data terminal DQ. DLL 1-12 generates a signal delay-synchronized with the external clocks CK and /CK, and supplies the signal to the DQ input/output buffer 1-13. The read data from the memory cell array 1-1 are supplied from the latch circuit 1-11 to the DQ input/output buffer 1-13, and the DQ input/output buffer 1-13 outputs the data read from the data terminal DQ at a double data rate using the rising and falling edges of the clock signal synchronized with the external clock CK by DLL 1-12.

DM is a data mask signal of the write data; data is written during write operation when the DM signal is at a low level. DQS and /DQS are differential data strobe signals determining the timing of data write and read operations, and are I/O signals that become input signals during write operation and output signals during read operation.

A control circuit for DQS 1-16 controls a DQS input/output buffer 1-15 along with the read/write operations of the semiconductor device 100. The control circuit for DQS 1-16 includes a function of controlling the slew rate of the DQS and DQSB signals outputted from the DQS and DQSB terminals according to the read data outputted from the DQ terminals during read operation, and the DQS input/output buffer 1-15 outputs the data strobe signals having the slew rate adjusted based on a control signal outputted from the control circuit for DQS 1-16. Further, FIG. 3 simply shows a typical example of a DRAM device as an example of a semiconductor device, and the present invention is not limited to this configuration.

FIG. 4 is a circuit block diagram extracting sections of circuit relating to the operation in which the read data are outputted from the DQ terminals from the DQ input/output buffer 1-13, the DQS input/output buffer 1-15, and the control circuit for DQS 1-16 in FIG. 3. Although the DQ input/output buffer 1-13 and the DQS input/output buffer 1-15 include the functions of receiving external data and data strobe signals, circuits relating to these functions are omitted in FIG. 4.

In FIG. 4, DRS and DFS are signals controlling the output potential of DQS and DQSB. DR0 to DRm and DF0 to DFm are signals controlling the output data of DQ0 to DQm respectively. LCLKOE is a signal controlling the output timing of DQS and DQSB, and DQ0 and DQ1 to DQm. In FIG. 4, 201 denotes a DQS output circuit; 202 a DQSB output circuit; 203 the output circuit of DQ0; and 204 the output circuit of DQm. Output circuits of DQ1 to DQm-1 are abbreviated. As shown in 203 and 204, the output circuits of DQ0 to DQm have the identical circuit configuration. 205 denotes a multiplexer circuit operating so as to output received DRS and DFS, alternating between them for each rising and falling edge of LCLKOE. Generally speaking, in a DRAM having high-speed input/output interface, the internal frequency is lower than the external frequency. An output operation matching the external frequency is realized by having a multiplexer that operates at the same frequency as the external frequency alternately output internal data transferred in parallel at a low operating frequency. The multiplexer circuits 205 have the same circuit configuration and operate identically for the DQS, DQSB and DQ0 to DQm terminals. However, the DQS, DQSB, and DQ0 to DQm supply different signals to the multiplexers.

The control circuit for DQS 1-16 includes the comparator circuit 301. The comparator circuit is a circuit that compares changes in the data outputted from the DQ terminals before and after the edge of the DQS signal in synchronization with the rise and fall edges of the DQS and DQSB signals. DR0 to DRm, i.e., signals outputted from the DQ terminals in synchronization with the rise edge of the DQS signal, and DF0 to DFm, i.e., signals outputted from the DQ terminals in synchronization with the fall edge of the DQS signal, are fed to the comparator circuit 301 as input signals. A plurality of control lines controlling the slew rates of the DQS output circuit 201 and the DQSB output circuit 202 are connected from the comparator circuit 301 to the DQS output circuit 201 and the DQSB output circuit 202. Further, PMOS transistors 505, 605, and so on having the respective power supply connected to VDDQ and NMOS transistors 506, 606, and so on having the respective power supply connected to VSSQ are provided in the DQS output circuit 201, the DQSB output circuit 202, and DQ0 to DQm output circuits 203 and 204, and a drain of each output transistor is connected to the corresponding output terminal.

Further, PMOS transistors and NMOS transistors are used as the output transistors of the output circuits in this example, however, this is merely an example, and other circuit configurations and other kinds of output transistors may be employed as long as each output circuit outputs high level and low level.

Figure 5:
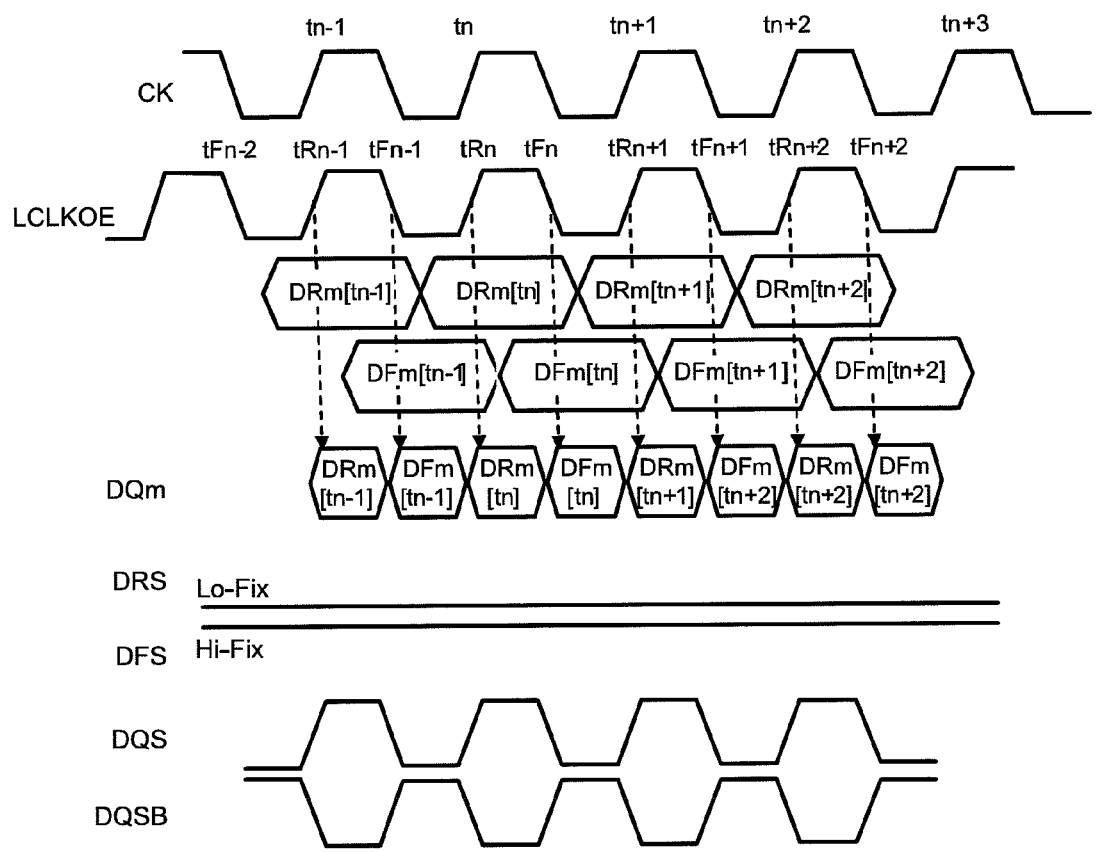
FIG. 5 is an operation timing diagram of the data signal output circuit in the synchronous semiconductor memory device.

FIG. 5 is an operation timing diagram when the read data are outputted from the circuits in FIG. 4. The external clock CK is a reference clock signal for the operation between the semiconductor device 100 and the memory controller connected to the semiconductor device 100. A control signal is generated by the DLL 1-12 inside the semiconductor device 100 in synchronization with the external clock CK. LCLKOE is a reference signal for switching between the rise and fall of the DQS and DQSB signals and for switching the data of the DQ signal serially outputted from the DQ terminal. For LCLKOE, signals having the same frequency are generated by the DLL 1-12 in synchronization with the external clock CK. DRm [tn−1], DRm [tn], DRm [tn+1], and DRm [tn+2] are signals outputted in synchronization with the rise of the DQS signal out of the data signals serially outputted from the DQm terminal. Note that m is a natural number and m+1 number of the DQ output terminals from DQ0 to DQm are required. Generally speaking, the actual m+1 number (the number of the DQ output terminals) is tend to be 4, 8, and 16, however, m can be any number. Similarly, DFm [tn−1], DFm [tn], DFm [tn+1], and DFm [tn+2] are signals outputted in synchronization with the fall of the DQS signal out of the data signals serially outputted from the DQm terminal.

DQm is a data signal outputted from the DQm output terminal. The DRm signal is outputted from the DQm terminal in synchronization with the rise of the DQS signal (the fall of the DQSB signal), and the DFm signal is outputted in synchronization with the fall of the DQS signal (the rise of the DQSB signal). The DRS signal is a signal fixed to a low level and for outputting a low level signal from the DQS terminal when the multiplexer 205 is switched by LCLKOE. Similarly, the DFS signal is a signal fixed to a high level and for outputting a high level signal from the DQS terminal when the multiplexer 205 is switched by LCLKOE. The DQS signal and the DQSB signal are outputted from the DQS terminal and the DQSB terminal respectively.

In other words, when the DQS terminal rises and the DQSB terminal falls in synchronization with the rise of the external clock CK at timing tn, the data outputted from the DQm terminal transition from DFm [tn−1] to DRm [tn]. Further, when the DQS terminal falls and the DQSB terminal rises in synchronization with the fall of the external clock CK at the timing tn, the data outputted from the DQm terminal transition from DRm [tn] to DFm [tn].

FIGS. 6A, 6B, 6C, 7A, 7B, and 7C show concrete circuit configurations in which the slew rate of the DQS terminal and the DQSB terminal is automatically adjusted by the data outputted from the DQ terminal. FIG. 6A is a more concrete block diagram of the DQS output circuit 201. More specifically, the internal circuit configurations of the first drive circuit 501 that receives the output signal from the comparator circuit 301 and drives a gate of the PMOS output transistor 505 and the second drive circuit 502 that drives a gate of the NMOS output transistor 506 are shown.

The first drive circuit 501 is constituted by a CMOS inverter constituted by a PMOS transistor 510 and an NMOS transistor 507 to which a DSPT signal having the same phase as the DQS signal is connected as an input signal, and outputting a DSPB signal having the phase opposite to that of the DQS signal, and a circuit that controls the falling speed of the DSPB signal. Further, the DSPB signal is connected to the gate of the PMOS output transistor 505. Therefore, the DSPB signal controls ON/OFF of the PMOS output transistor 505.

The circuit, included in the first drive circuit 501, that controls the falling speed of the DSPB signal comprises an NMOS transistor 509 having its source connected to the power supply VSSQ and receiving a DRDm signal outputted from the comparator circuit 301 at its gate, and an NMOS transistor 508 connected between the NMOS transistor 509 and DSPB. Further, the DSPT signal is connected to a gate of the NMOS transistor 508. Further, as for the pair of the NMOS transistor 509 and the NMOS transistor 508 serially connected between the DSPB signal and the power supply VSSQ, m+1 pairs of them are provided, corresponding to the fact that there are m+1 number of the DQ terminals, from DQ0 to DQm. The m+1 pairs of the transistors are respectively connected in parallel between the DSPB signal and the power supply VSSQ. Further, each of the DRD0 to DRDm signals corresponding to each of the m+1 DQ terminals is connected to each of the m+1 NMOS transistors 509.

Similarly, the second drive circuit 502 is constituted by a CMOS inverter constituted by a PMOS transistor 517 and an NMOS transistor 520 to which a DSNT signal having the same phase as the DQS signal is connected as an input signal, and a circuit that controls the rising speed of the CMOS inverter. Further, an output signal of this CMOS inverter is outputted as a DSNB signal and is connected to the gate of the NMOS output transistor 506. In other words, the DSNB signal controls ON/OFF of the NMOS output transistor 506.

The circuit, included in the second drive circuit 502, that controls the rising speed of the DSNB signal comprises a PMOS transistor 519 having its source connected to the power supply VDDQ and receiving a DFDm signal outputted from the comparator circuit 301 at its gate, and a PMOS transistor 518 connected between the PMOS transistor 519 and DSNB. As for the pair of the PMOS transistor 519 and the PMOS transistor 518 serially connected between the DSNB signal and the power supply VDDQ, m+1 pairs of them, corresponding to the number of the DQ terminals, are provided in parallel between the DSNB signal and the power supply VDDQ, the DSNT signal is connected in common to gates of the m+1 PMOS transistors 518, and m+1 number of the DFD0 to DFDm signals different from each other are connected to gates of the m+1 PMOS transistors 519.

Further, FIG. 6B is a block diagram showing a comparator circuit 301A that generates a signal controlling the first drive circuit 501 and a comparator circuit 301B that generates a signal controlling the second drive circuit 502 in the comparator circuit 301. m+1 number of the comparator circuits 301A and m+1 number of the comparator circuits 301B, corresponding to the number of the DQ terminals, are provided, and the m+1 comparator circuits 301A and 301B respectively output the DRDm signals and the DFDm signals. FIG. 6B shows only the comparator circuits 301A and 301B for DRDm and DFDm signals, but m+1 pairs of comparator circuits 301A and 301B are provided for DRD0 and DFD0 signals to DRDm and DFDm signals in the comparator circuit 301. Further, FIG. 6C is a Karnaugh map showing the logic between the input signal and the output signal of the comparator circuit 301A and the comparator circuit 301B for DRDm and DFDm signals.

[Operation of Automatically Adjusting the Slew Rate of the Rising Edge of the DQS Signal]

Next, an operation in which the DQS output circuit 201 automatically adjusts the slew rates of the rising and falling edges of the DQS signal in FIGS. 6A, 6B, and 6C will be described. First, an operation in which the slew rate of the rising edge of the DQS signal at the timing tn in the operation timing diagram in FIG. 5 is adjusted will be described. The comparator circuit 301A and the first drive circuit 501 automatically control the adjustment of the slew rate of the rising edge of the DQS signal.

As shown in the operation timing diagram in FIG. 5, when the DQS signal rises at the timing tn, the data outputted from the DQm terminal transition from DFm [tn−1] to DRm [tn]. A flip-flop circuit 311 of the comparator circuit 301A holds the inverted data of DFm [tn−1] as long as the period of DRm [tn] shown in FIG. 5. Meanwhile, since DRm [tn] is fed to DRm of the comparator circuit 301A, the DRDm signal goes to a high level only when DFm [tn−1] is at a low level and DRm [tn] is at a high level, and goes to a low level at other times. In other words, the DRDm signal goes to a high level in the case where the DQS signal rises from a low level to a high level and the DQm signal simultaneously rises from a low level to a high level, and the DRDm signal goes to a low level in other cases where the DQm signal maintains a high level or low level, or falls from a high level to a low level.

Since the DRDm signal is connected to the gate of the NMOS transistor 509, when the DQS signal rises with the DRDm signal at a high level, the NMOS transistors 508 and 509 turn on simultaneously with the NMOS transistor 507, and the gate of the PMOS output transistor 505 can be acceleratingly and quickly fallen. As a result, the slew rate of the PMOS output transistor can be increased and the rising of the DQS signal can be accelerated. In other words, in the case where the DQS signal rises from a low level to a high level and the data signal DQm simultaneously rises from a low level to a high level, the slew rate of the DQS terminal is increased so that the DQS terminal quickly rises from a low level to a high level.

[Operation of Automatically Adjusting the Slew Rate of the Falling Edge of the DQS Signal]

Next, an operation in which the slew rate of the falling edge of the DQS signal between the timing tn and timing tn+1 in the operation timing diagram in FIG. 5 is adjusted will be described. The comparator circuit 301B and the second drive circuit 502 in FIGS. 6A and 6B perform the automatic adjustment of the slew rate of the falling edge of the DQS signal.

As shown in the operation timing diagram in FIG. 5, when the DQS signal falls between the timing tn and the timing tn+1, the data outputted from the DQm terminal transition from DRm [tn] to DFm [tn]. A flip-flop circuit 315 of the comparator circuit 301B holds the inverted data of DRm [tn] as long as the period of DFm [tn] shown in FIG. 5. Meanwhile, since DFm [tn] is fed to DFm of the comparator circuit 301B, the DFDm signal goes to a low level only when DRm [tn] is at a high level and DFm [tn] is at a low level, and goes to a high level at other times. In other words, the DFDm signal goes to a low level in the case where the DQS signal falls from a high level to a low level and the DQm signal simultaneously falls from a high level to a low level, and the DFDm signal goes to a high level in other cases where the DQm signal maintains a high level or low level, or rises from a low level to a high level.

Since the DFDm signal is connected to the gate of the PMOS transistor 519, when the DQS signal falls with the DFD signal at a low level, the PMOS transistors 518 and 519 turn on simultaneously with the PMOS transistor 517, and the gate of the NMOS output transistor 506 can be acceleratingly and quickly raised. As a result, the slew rate of the NMOS output transistor 506 can be increased and the falling of the DQS signal can be accelerated. In other words, in the case where the DQS signal falls from a high level to a low level and the data signal DQm simultaneously falls from a high level to a low level, the slew rate of the DQS terminal is increased so that the DQS terminal quickly falls from a high level to a low level.

FIGS. 7A, 7B, and 7C show circuit configurations for automatically adjusting the slew rate of the DQSB terminal. FIG. 7A is a concrete circuit block diagram of the DQSB output circuit 202. The basic configuration is identical to that of the DQS output circuit 201 shown in FIG. 6A. The first drive circuit 601 that controls ON/OFF of the PMOS output transistor 605 and the second drive circuit 602 that controls ON/OFF of the NMOS output transistor 606 are provided.

The first drive circuit 601 is constituted by a CMOS inverter constituted by a PMOS transistor 610 and an NMOS transistor 607 to which an input signal having the same phase as the DQSB signal is connected and outputting a signal having the phase opposite to that of the DQSB signal to a gate of the PMOS output transistor 605, and a circuit that adjusts the slew rate of the rising edge of the PMOS output transistor 605.

The circuit, included in the first drive circuit 601, that adjusts the slew rate comprises an NMOS transistor 609 having its source connected to the power supply VSSQ and receiving a DFBm signal outputted from the comparator circuit 301 at its gate, and an NMOS transistor 608 connected between the NMOS transistor 609 and the gate of the PMOS output transistor 605. Further, a signal having the same phase as DQSB is connected to a gate of the NMOS transistor 608. Further, as for the pair of the NMOS transistor 609 and the NMOS transistor 608 serially connected between the gate of the PMOS output transistor 605 and the power supply VSSQ, m+1 pairs of them are provided, corresponding to the number of the DQ terminals, and are respectively connected in parallel between the gate of the PMOS output transistor 605 and the power supply VSSQ. Moreover, each of the DFB0 to DFBm signals corresponding to each of the m+1 DQ terminals is connected to each of the m+1 NMOS transistors 609.

Similarly, the second drive circuit 602 is constituted by a CMOS inverter constituted by a PMOS transistor 617 and an NMOS transistor 620 to which a signal having the same phase as the DQSB signal is connected as an input signal, and a circuit that controls the rising speed of the CMOS inverter. Further, an output signal of this CMOS inverter is connected to a gate of the NMOS output transistor 606, and controls ON/OFF of the NMOS output transistor 606.

The circuit, included in the second drive circuit 602, that controls the rising speed of the gate signal of the NMOS output transistor 606 comprises a PMOS transistor 619 having its source connected to the power supply VDDQ and receiving a DRBm signal outputted from the comparator circuit 301 at its gate, and a PMOS transistor 618 connected between the PMOS transistor 619 and the gate of the NMOS output transistor 606. As for the pair of the PMOS transistor 619 and the PMOS transistor 618 serially connected between the gate of the NMOS output transistor 606 and the power supply VDDQ, m+1 pairs of them, corresponding to the number of the DQ terminals, are provided in parallel between the gate of the NMOS output transistor 606 and the power supply VDDQ, a signal having the same phase as DQSB is connected in common to gates of the m+1 PMOS transistors 618, and m+1 number of the DRB0 to DRBm signals different from each other are connected to gates of the m+1 PMOS transistors 619.

Further, FIG. 7B is a block diagram showing a comparator circuit 301C that generates the DRBm signal and a comparator circuit 301D that generates the DFBm signal in the comparator circuit 301. Further, FIG. 7C is a Karnaugh map showing the logic between the input signal and the output signal of the comparator circuit 301C and the comparator circuit 301D.

[Operation of Automatically Adjusting the Slew Rate of the Falling Edge of the DQSB Signal]

Next, an operation in which the DQSB output circuit 202 automatically adjusts the slew rates of the rising and falling edges of the DQSB signal in FIGS. 7A, 7B, and 7C will be described. First, an operation in which the slew rate of the falling edge of the DQSB signal at the timing to in the operation timing diagram in FIG. 5 is adjusted will be described. The comparator circuit 301C in FIG. 7B and the second drive circuit 602 in FIG. 7A automatically adjust the slew rate of the falling edge of the DQSB signal.

With reference to the operation timing diagram in FIG. 5, when the DQSB signal falls at the timing tn, the data outputted from the DQm terminal transition from DFm [tn−1] to DRm [tn]. A flip-flop circuit 313 of the comparator circuit 301C holds the inverted data of DFm [tn−1] as long as the period of DRm [tn] shown in FIG. 5. Meanwhile, since DRm [tn] is fed to DRm, the DRBm signal goes to a low level only when DFm [tn−1] is at a high level and DRm [tn] is at a low level, and the DRBm signal goes to a high level at other times. In other words, the DRBm signal goes to a low level in the case where the DQSB signal falls from a high level to a low level and the DQm signal simultaneously falls from a high level to a low level, and the DRBm signal goes to a high level in other cases where the DQm signal maintains a high level or low level, or rises from a low level to a high level.

Since the DRBm signal is connected to the gate of the PMOS transistor 619, when the DQSB signal falls with the DRBm signal at a low level, the PMOS transistors 618 and 619 turn on simultaneously with the PMOS transistor 617, and the gate of the NMOS output transistor 606 can be acceleratingly and quickly raised. As a result, the slew rate of the NMOS output transistor can be increased and the falling of the DQSB signal can be accelerated. In other words, in the case where the DQSB signal falls from a high level to a low level and the data signal DQm simultaneously falls from a high level to a low level, the slew rate of the DQS terminal is increased so that the DQSB terminal quickly falls from a high level to a low level.

[Operation of Automatically Adjusting the Slew Rate of the Rising Edge of the DQSB Signal]

Next, an operation in which the slew rate of the rising edge of the DQSB signal between the timing tn and the timing tn+1 in the operation timing diagram in FIG. 5 is adjusted will be described. The first drive circuit 601 in FIG. 7A and the comparator circuit 301D in FIG. 7B automatically control the adjustment of the slew rate of the rising edge of the DQSB signal.

As shown in the operation timing diagram in FIG. 5, when the DQSB signal rises between the timing tn and the timing tn+1, the data outputted from the DQm terminal transition from DRm [tn] to DFm [tn]. A flip-flop circuit 317 of the comparator circuit 301D holds the inverted data of DRm [tn] as long as the period of DFm [tn] shown in FIG. 5. Meanwhile, since DFm [tn] is fed to DFm, the DFBm signal goes to a high level only when DRm [tn] is at a low level and DFm [tn] is at a high level, and goes to a low level at other times. In other words, the DFBm signal goes to a high level in the case where the DQSB signal rises from a low level to a high level and the DQm signal simultaneously rises from a low level to a high level, and the DFBm signal goes to a low level in other cases where the DQm signal maintains a high level or low level, or falls from a high level to a low level.

Since the DFBm signal is connected to the gate of the NMOS transistor 609, when the DQSB signal rises with the DFBm signal at a high level, the NMOS transistors 608 and 609 turn on simultaneously with the NMOS transistor 607, and the gate of the PMOS output transistor 605 can be acceleratingly and quickly fallen. As a result, the slew rate of the PMOS output transistor 605 can be increased and the rising of the DQSB signal can be accelerated. In other words, in the case where the DQSB signal rises from a low level to a high level and the data signal DQm simultaneously rises from a low level to a high level, the slew rate of the DQS terminal is increased so that the DQS terminal quickly rises from a low level to a high level.

Figure 8:
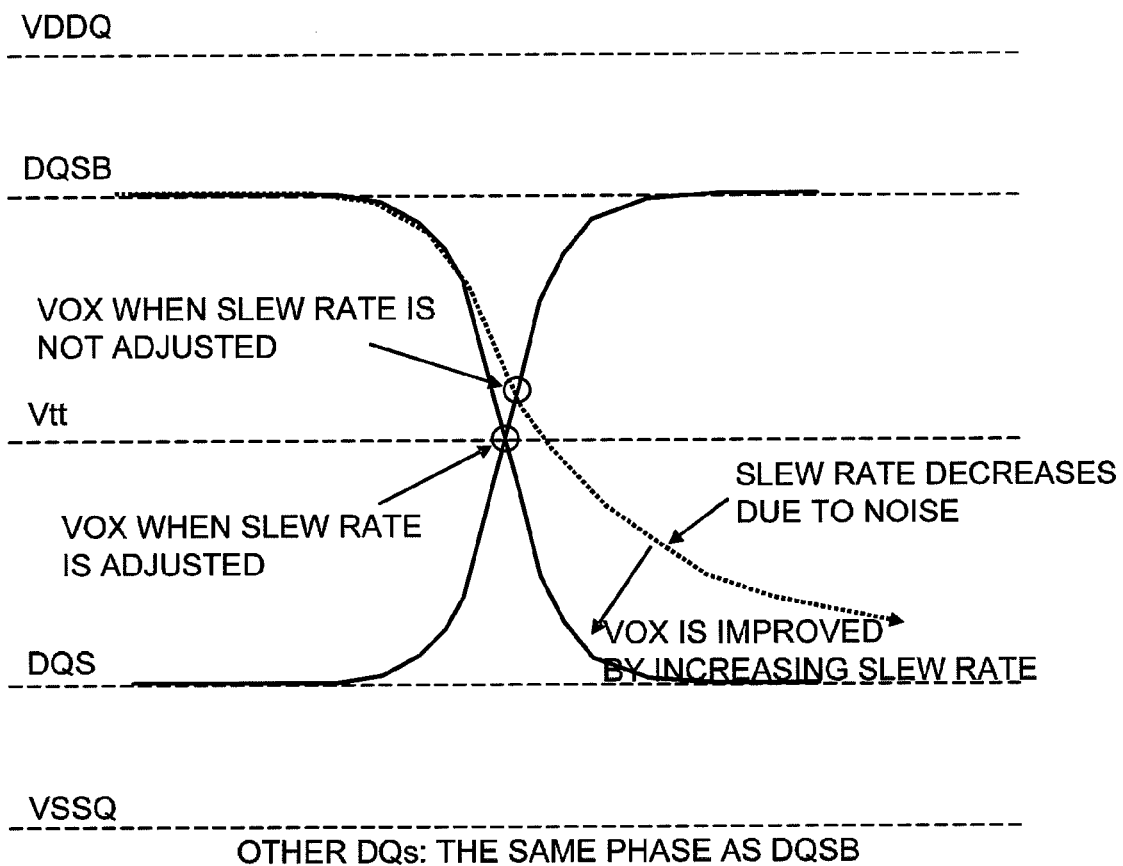
FIG. 8 is an operational waveform diagram of the synchronization signal output circuit in the example.

FIG. 8 is an operational waveform diagram of a case where all bits of the DQ signal fall simultaneously at the same time as the DQSB signal falls from a high level to a low level in Example 1. In the case where the slew rate is not automatically adjusted, as described using FIG. 2, the power supply VSSQ floats because all bits of the DQ signal fall at once, delaying the fall of the DQSB signal, and Vox will deviate up to a higher voltage than Vtt.

On the other hand, in Example 1, the circuits described using FIGS. 7A and 7B automatically adjust so that the more the number of bits simultaneously fall in synchronization with the fall of the DQSB signal, the more rapidly the gate potential of the NMOS output transistor 606 is raised, increasing the slew rate of the falling edge of the DQSB terminal. As a result, the delay in the fall of the DQSB signal caused by the floating of the power supply VSSQ can be compensated, and the deviation of the voltage Vox from the voltage Vtt can be avoided.

Example 2

FIG. 9 is a block diagram of a DQS output circuit 201A of Example 2. Further, FIG. 10A is a circuit block diagram of comparator circuits that output signals DRDm, DRBm, DFDm, and DFBm controlling the slew rate of the DQS output circuit 201A, and FIG. 10B is their Karnaugh map. FIG. 10A shows only a set of comparator circuits 301A, 301B, 301E, and 301F for output data of DQm terminal, but m+1 sets of comparator circuits 301A, 301B, 301E, and 301F are provided for output data of DQ0 to DQm terminals and their output signals are supplied to the DQS output circuit 201A.

The basic circuit configuration of the DQS output circuit 201A in FIG. 9 is identical to the DQS output circuit 201 in FIG. 6A, except that the first drive circuit 501 and the second drive circuit 502 are respectively replaced by a first drive circuit 501A and a second drive circuit 502A. Therefore, differences between the first drive circuit 501A and the second drive circuit 502A, and the first drive circuit 501 and the second drive circuit 502 in FIG. 6A will be described.

Compared to the first drive circuit 501 of the DQS output circuit 201 shown in FIG. 6A, circuits are added to the first drive circuit 501A of the DQS output circuit 201A in FIG. 9; PMOS transistors 529 and 528 are provided between the DSPB signal, which is a pre-drive signal for the PMOS output transistor 505, and the power supply VDDQ. Further, m+1 pairs of the PMOS transistors 529 and 528, corresponding to the number of the DQ terminals, are provided in parallel, and each of the DFB0 to DFBm signals outputted from the comparator circuits 301F (FIG. 10A shows one example of comparator circuit 301F for DFBm signal) is connected to each PMOS transistor 529. The first drive circuit 501A is otherwise configured identically to the first drive circuit 501 in FIG. 6A.

Similarly, compared to the second drive circuit 502 of the DQS output circuit 201 shown in FIG. 6A, circuits are added to the second drive circuit 502A; NMOS transistors 539 and 538 are provided between the DSNB signal, which is a pre-drive signal for the NMOS output transistor 506, and a power supply VSSB. Further, m+1 pairs of the NMOS transistors 539 and 538, corresponding to the number of the DQ terminals, are provided in parallel, and each of the DRB0 to DRBm signals outputted from the comparator circuit 301E in FIG. 10A is connected to each NMOS transistor 539. The second drive circuit 502A is otherwise configured identically to the second drive circuit 502 in FIG. 6A.

Next, operational differences between the DQS output circuit 201A in Example 2 and the DQS output circuit 201 in Example 1 will be described. Since sections in Example 2 configured identically to Example 1 operate identically to the corresponding sections in Example 1, explanations of them will be omitted.

[The Rising Operation of the DQS Signal]

When the DQS terminal rises from a low level to a high level at the timing tn in the operation timing chart in FIG. 5, the data outputted from the DQm terminal transition from DFm [tn−1] to DRm [tn]. In FIG. 9, when the DQS terminal rises from a low level to a high level, the NMOS output transistor 506 needs to transition from an ON state to an OFF state. Therefore, DSNB, the gate signal of the NMOS output transistor 506, is transitioned from a high level to a low level. In Example 1 described using FIG. 6A, the NMOS transistor 520 is the only NMOS transistor that discharges DSNB to a low level, however, in Example 2 shown in FIG. 9, the serially connected NMOS transistors 538 and 539 contribute to discharging of DSNB to a low level, in addition to the NMOS transistor 520. The DRBm signal shown in FIGS. 10A and 10B is connected to a gate of the NMOS transistor 539. As shown in FIGS. 10A and 10B, this DRB signal goes to a low level only when the data outputted from the DQm terminal transition from a high level to a low level (from DFm [tn−1] to DRm [tn]) and goes to a high level at other times.

In other words, since the NMOS transistor 539 turns on in a case where the DQm terminal maintains a high level or low level or rises from a low level to a high level when the DQS terminal rises from a low level to a high level, the NMOS transistors 539 and 538, too, contribute to discharging of DSNB to a low level in parallel with the NMOS transistor 520. The NMOS output transistor 506 is turned off by the discharge of DSNB to a low level.

On the other hand, since the NMOS transistor 539 does not turn on in a case where the DQm terminal reversely falls from a high level to a low level when the DQS terminal rises from a low level to a high level, the discharge of DSNB to a low level is delayed. When the discharge of DSNB to a low level is delayed, the turn-off of the NMOS output transistor 506 is delayed and the slew rate of the DQS terminal is decreased. In other words, the DQS output circuit 201A in FIG. 9 automatically adjusts the slew rate to be decreased when the DQm terminal reversely falls against the rise of the DQS terminal.

[The Falling Operation of the DQS Signal]

On the other hand, when the DQS signal falls from a high level to a low level between the timing tn and the timing tn+1 in the operation timing diagram in FIG. 5, the data outputted from the DQm terminal transition from DRm [tn] to DFm [tn]. At this time, since the PMOS output transistor 505 in FIG. 9 needs to transition from an ON state to an OFF state, DSPB, the gate signal of the PMOS output transistor 505, is transitioned from a low level to a high level. In Example 2 shown in FIG. 9, the PMOS transistors that charge DSPB to a high level are the serially connected PMOS transistors 528 and 529 contributing to charging of DSPB to a high level, in addition to the PMOS transistor 510. The DFBm signal shown in FIGS. 10A and 10B is connected to a gate of the PMOS transistor 529. As shown in FIGS. 10A and 10B, this DFB signal goes to a high level only when the data outputted from the DQm terminal transition from a low level to a high level (from DRm [tn] to DFm [tn]) and goes to a low level at other times.

Since the PMOS transistor 529 does not turn on in a case where the DQm terminal rises from a low level to a high level when the DQS terminal falls from a high level to a low level, the charging of DSPB to a high level is relatively delayed. When the charging of DSPB to a high level is delayed, the turn-off of the PMOS output transistor 505 is delayed and the slew rate of the DQS terminal is decreased. In other words, the DQS output circuit 201A in FIG. 9 automatically adjusts the slew rate to be decreased when the DQm terminal reversely rises against the fall of the DQS terminal.

The first drive circuit 501A and the second drive circuit 502A of the DQS output circuit 201A comprise the circuit function of increasing the slew rate when the DQ terminal and the DQS terminal transition in the same direction, the same function the first drive circuit 501 and the second drive circuit 502 comprise. Therefore, the DQS output circuit 201A adjusts the slew rate in three ways for three cases: the case where the DQ signal transitioning at the same time as the DQS terminal rises or falls transitions in the reverse direction, the case where it does not change, and the case where it transitions in the same direction. With the assumption that there are m+1 DQ terminals, since the slew rate of the DQS terminal is adjusted in three steps for each DQ terminal, the slew rate of the DQS terminal can be automatically controlled in 3*(m+1) ways according to the data of the DQ signal that transitions simultaneously with each rise or fall.

Further, regarding the DQSB terminal and DQSB signal, although this is not shown in the drawing, the DQSB output circuit can automatically adjust the slew rate of the DQSB terminal to be decreased in a case where the logic level outputted from the DQm terminal and the logic level outputted from the DQSB terminal simultaneously transition in the opposite directions, similarly to the case of the DQS terminal and the DQS signal.

Further, each disclosure of Patent Documents above is incorporated herein by reference thereto.

Particularly, P-channel transistor or PMOS transistor is a representative example of a transistor of the first conductivity type, and N-channel transistor or NMOS transistor is a representative example of a transistor of the second conductivity type without being limited to these examples.

In addition to MOS (Metal Oxide Semiconductor) transistors, various field-effect transistors such as MIS (Metal-Insulator Semiconductor) transistors, and TFTs (Thin Film Transistor) can be used. Further, non-field-effect transistors such as bipolar transistors can be used as well.

The transistors may be formed on a P-type or N-type semiconductor substrate, or SOI (Silicon on Insulator) substrate or other kinds of a semiconductor substrate.

The semiconductor device according to the present invention can be applied not only to a semiconductor memory device, but also to an output buffer of a semiconductor device that outputs data to another semiconductor device. For instance, the semiconductor device according to the present invention can be applied to a memory controller, CPU (Central Processing Unit), MCU (Micro Control Unit), DSP (Digital Signal Processor), ASIC (Application Specific Integrated Circuit), ASSP (Application Specific Standard Circuit), DRAM (Dynamic Random Access Memory), SRAM (Static Random Access Memory), and non-volatile memory device (for instance flash memory).

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A semiconductor device comprising:
    a first circuit that outputs data to a first output terminal and a second circuit that outputs data to a second output terminal; wherein
    said first circuit and said second circuit output data in synchronization with each other; and
    said second circuit adjusts a slew rate from a first state to a second state based on a transition from first data outputted from said first circuit to second data following said first data, and outputs data in synchronization with said second data with a slew rate in said second state.

2. The semiconductor device as defined in claim 1, wherein said second circuit is a circuit that outputs a synchronization signal synchronized to the transition of data outputted from said first output terminal as said data from said second output terminal, and
    said slew rate is adjusted to increase in a case where logic levels of the data outputted from said first output terminal and the synchronization signal outputted from said second output terminal transition between a first logic level and a second logic level in a same direction and in synchronization with each other.

3. The semiconductor device as defined in claim 2, wherein said slew rate is adjusted to decrease in a case where said logic levels of the data outputted from said first output terminal and the synchronization signal outputted from said second output terminal change in reverse directions and in synchronization with each other.

4. The semiconductor device as defined in claim 1 further comprising:
    a comparator circuit that compares said first data and said second data; wherein
    said second circuit includes an output transistor coupled to said second output terminal and a drive circuit coupled to said output transistor, and said drive circuit switches said output transistor with its drive capability changed based on the comparison results of said comparator circuit.

5. The semiconductor device as defined in claim 1 further comprising:
    a comparator circuit that compares said first data and said second data; wherein
    said second circuit comprises:
    an output transistor of a first conductivity type, coupled to said second output terminal, that turns on when said second output terminal outputs a signal of a first logic level;
    an output transistor of a second conductivity type, coupled to said second output terminal, that turns on when said second output terminal outputs a signal of a second logic level;
    a first drive circuit that drives said output transistor of the first conductivity type; and
    a second drive circuit that drives said output transistor of the second conductivity type;
    said first drive circuit drives said output transistor of the first conductivity type with its drive capability increased so that said output transistor of the first conductivity type quickly transitions from an OFF state to an ON state when said output transistor of the first conductivity type transitions from an OFF state to an ON state and the comparison results of said comparator circuit indicate that said first data are at the second logic level and said second data are at the first logic level; and
    said second drive circuit drives said output transistor of the second conductivity type with its drive capability increased so that said output transistor of the second conductivity type quickly transitions from an OFF state to an ON state when said output transistor of the second conductivity type transitions from an OFF state to an ON state and the comparison results of said comparator circuit indicate that said first data are at the first logic level and said second data are at the second logic level.

6. The semiconductor device as defined in claim 5, wherein said first drive circuit drives said output transistor of the first conductivity type with its drive capability decreased so that said output transistor of the first conductivity type slowly transitions from an ON state to an OFF state when said output transistor of the first conductivity type transitions from an ON state to an OFF state and the comparison results of said comparator circuit indicate that said first data are at the second logic level and said second data are at the first logic level; and
    said second drive circuit drives said output transistor of the second conductivity type with its drive capability decreased so that said output transistor of the second conductivity type slowly transitions from an ON state to an OFF state when said output transistor of the second conductivity type transitions from an ON state to an OFF state and the comparison results of said comparator circuit indicate that said first data are at the first logic level and said second data are at the second logic level.

7. The semiconductor device as defined in claim 2 further comprising: a third output terminal; and a third circuit that outputs an inverted synchronization signal from said third output terminal, the inverted synchronization signal having an inverted logic of the synchronization signal; wherein
    a slew rate of said third circuit is adjusted to increase in a case where the logic levels of the data outputted from said first output terminal and the inverted synchronization signal outputted from said third output terminal transition between said first logic level and said second level in the same direction and in synchronization with each other.

8. The semiconductor device as defined in claim 7, wherein said slew rate of said third circuit is adjusted to decrease in a case where said logic levels of the data outputted from said first output terminal and the inverted synchronization signal outputted from said third output terminal change in reverse directions and in synchronization with each other.

9. The semiconductor device as defined in claim 1, further comprising a storage circuit, wherein
said first data and said second data are data read from said storage circuit.

10. The semiconductor device as defined in claim 1, wherein said semiconductor device is a synchronous semiconductor memory device that outputs read data from a data input/output terminal in synchronization with a data strobe signal outputted from a data strobe signal input/output terminal in response to a read command supplied externally.

* * * * *